United States Patent
Koberstein

(10) Patent No.: US 9,722,603 B2
(45) Date of Patent: Aug. 1, 2017

(54) SWITCH HOUSING FOR CAPACITIVE SWITCHES

(75) Inventor: Udo Koberstein, Moos (DE)

(73) Assignee: TRW Automotive Electronics & Components GmbH (DE)

( * ) Notice: Subject to any disclaimer, the term of this patent is extended or adjusted under 35 U.S.C. 154(b) by 772 days.

(21) Appl. No.: 13/822,302

(22) PCT Filed: Sep. 13, 2011

(86) PCT No.: PCT/EP2011/065819
§ 371 (c)(1),
(2), (4) Date: May 16, 2013

(87) PCT Pub. No.: WO2012/034994
PCT Pub. Date: Mar. 22, 2012

(65) Prior Publication Data
US 2013/0270926 A1    Oct. 17, 2013

(30) Foreign Application Priority Data
Sep. 13, 2010   (DE) .................... 10 2010 045 199

(51) Int. Cl.
H03K 17/975    (2006.01)
H05K 7/00      (2006.01)
H03K 17/96     (2006.01)
B29C 45/16     (2006.01)
(Continued)

(52) U.S. Cl.
CPC .......... *H03K 17/962* (2013.01); *B29C 45/16* (2013.01); *H03K 17/9622* (2013.01); *B29C 2045/169* (2013.01); *H01H 2009/0285* (2013.01); *H01H 2011/0081* (2013.01); *H01H 2223/00* (2013.01); *H01H 2229/046* (2013.01);
(Continued)

(58) Field of Classification Search
CPC ............ H03K 17/962; H03K 17/9622; H03K 2217/960755; B29C 45/16; B29C 2045/169; Y10T 307/826; H01H 2223/00; H01H 2239/006; H01H 2011/0081; H01H 2009/0285; H01H 2229/046
USPC ......................................... 200/600; 361/837
See application file for complete search history.

(56) References Cited

U.S. PATENT DOCUMENTS

| 4,748,068 A | 5/1988 | Fahner et al. |
| 5,917,165 A | 6/1999 | Platt et al. |
| 6,110,576 A | 8/2000 | Decker et al. |

(Continued)

FOREIGN PATENT DOCUMENTS

| DE | 101 18 487 | 10/2002 |
| EP | 0 208 087 | 1/1987 |

(Continued)

*Primary Examiner* — Rexford Barnie
*Assistant Examiner* — Dru Parries
(74) *Attorney, Agent, or Firm* — Tarolli, Sundheim, Covell & Tummino LLP

(57) ABSTRACT

The switch housing for capacitive switches has an outer contact surface and flat electrode structures which are arranged on the inside and in a position opposite the contact surface and which are placed by two-component injection molding in recessed regions of the housing body injected from a first, electrically non-conductive plastic component by a second, electrically conductive plastic component. Preferably, both plastic components are a polycarbonate, the second plastic component containing carbon fibers.

16 Claims, 2 Drawing Sheets

(51) Int. Cl.
*H01H 9/02* (2006.01)
*H01H 11/00* (2006.01)
(52) U.S. Cl.
CPC .............. *H01H 2239/006* (2013.01); *H03K 2217/960755* (2013.01); *Y10T 307/826* (2015.04)

(56) References Cited

U.S. PATENT DOCUMENTS

| | | | |
|---|---|---|---|
| 2004/0097883 A1* | 5/2004 | Roe | 604/207 |
| 2005/0205407 A1* | 9/2005 | Hein et al. | 200/600 |
| 2007/0013787 A1* | 1/2007 | Pippel et al. | 348/223.1 |
| 2011/0043227 A1* | 2/2011 | Pance | G06F 1/1616 324/681 |
| 2012/0118714 A1* | 5/2012 | Shigeoka | H03K 17/962 200/181 |

FOREIGN PATENT DOCUMENTS

| | | |
|---|---|---|
| EP | 0208087 | 1/1987 |
| EP | 2 106 026 | 9/2009 |

\* cited by examiner

SWITCH HOUSING FOR CAPACITIVE SWITCHES

RELATED APPLICATIONS

This application corresponds to PCT/EP2011/065819, filed Sep. 13, 2011, which claims the benefit of German Application No. 10 2010 045 199.1, filed Sep. 13, 2010, the subject matter, of which are incorporated herein by reference in their entirety.

BACKGROUND OF THE INVENTION

The invention relates to a method of producing a switch housing for capacitive switches, to a switch housing which has integrated electrically conductive electrode structures, and to a capacitive switch equipped with the switch housing.

Capacitive switches are in principle composed of a flat electrode on one side of a dielectric material layer, the face of which facing away therefrom forming a contact surface. Switch housings for capacitive switches are usually made of plastic material. The front face of the switch housing forms the contact surface, and the face opposite thereto on the inside of the switch housing supports an electrically conductive electrode structure. Such electrode structures can be applied as conductive layers onto the electrically non-conductive plastic material of the switch housing using a so-called conductive lacquer or other electrically conductive materials. Only thin layers can be applied by means of usual coating methods. The required electrode structures may have a complex shape so that specific coating methods are required. For the secure contacting of the electrode structures, precise 3-D structures are necessary which can only be obtained with difficulty with a coating method. For applications in the automotive field, conventional coating solutions are furthermore mechanically susceptible and prone to corrosion.

SUMMARY OF THE INVENTION

By the invention, a method of producing a switch housing for capacitive switches having a contact surface by two-component injection molding is provided. A housing body is first injected using a first, electrically insulating plastic component, the housing body having recessed regions on the inside in a position opposite the contact surface. A second, electrically conductive plastic component is then injected into the recessed regions, which contains the same base material as the first plastic component, a polycarbonate, for example. The conductivity of the second plastic component results from the addition of conductive particles such as carbon fibers. The structures injected using the electrically conductive plastic component may have any complexity and a sufficient thickness to ensure a high mechanical strength. The electrode structure thus realized enter into an intimate connection with the first, electrically non-conductive plastic component, as both plastic components have the same base material.

The switch housing for capacitive switches produced by the invention has an outer contact surface and flat electrode structures which are arranged on the inside in a position opposite the contact surface and which are placed by two-component injection molding in recessed regions of the housing body injected from a first, electrically non-conductive plastic component using a second, electrically conductive plastic component. Preferably, both plastic components are a polycarbonate, the second plastic component containing carbon fibers.

In the preferred embodiment, the flat electrode structures comprise recessed windows, and the contact surface is translucent or transparent opposite the recessed windows. The switch according to the invention equipped with this switch housing has symbols arranged on the contact surface of the switch housing which can be illuminated through the recessed windows of the electrode structures and through thinned wall regions of the switch housing.

In a further development of the invention, the flat electrode structures are configured with integrally formed contact tags which are guided to a contacting block formed integrally on the inside of the housing body. The contacting block has cutouts in which the ends of the contact tags are positioned and form flush contacting surfaces with the surface of the contacting block. It is therefore easily possible to contact the electrode structures with a circuit board arranged on top by a simple insertion of conductive rubber structures.

BRIEF DESCRIPTION OF THE DRAWINGS

Further features and advantages of the invention will become apparent from the description below of an advantageous embodiment and from the drawings to which reference is made and which show.

DESCRIPTION OF EXEMPLARY EMBODIMENT

Figure 1:
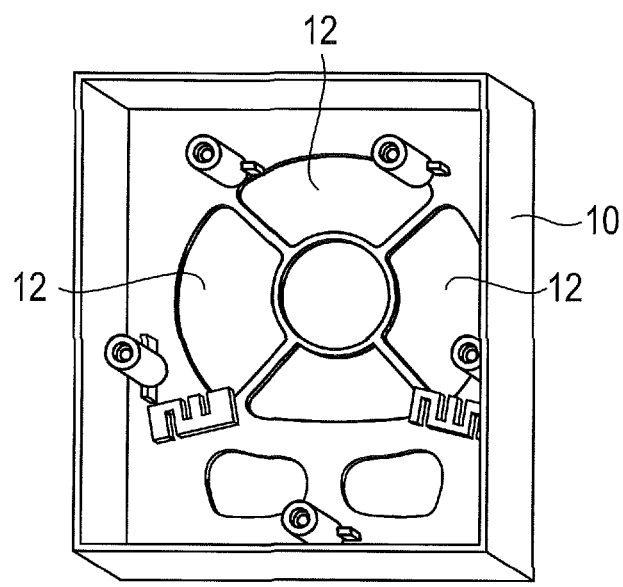
FIG. 1 a perspective view of a switch housing prior to the incorporation of electrode structures.
Figure 2:
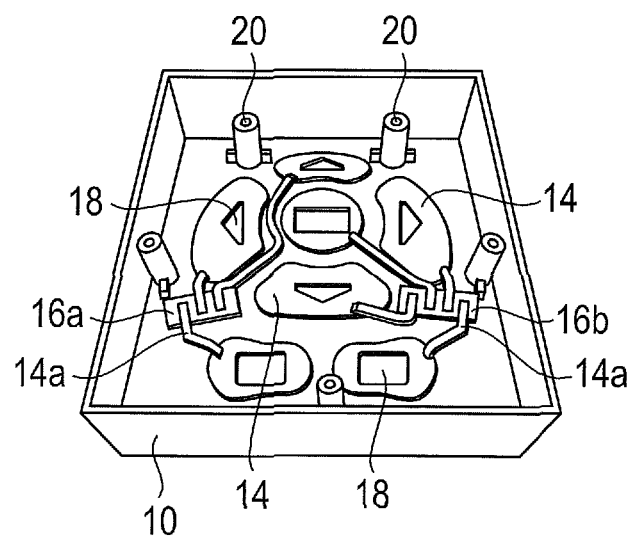
FIG. 2 the switch housing with the electrode structures inserted.

The switch housing for a capacitive switch is produced in a two-component injection molding process. FIG. 1 shows a generally cuboidal switch housing which is injected using a first, electrically non-conductive plastic component with a view to the inside. The end face of the switch housing generally denoted by 10, which is opposite the inside forms a contact surface of the capacitive switch. On the opposite inside, the corresponding wall is configured with flat cutouts 12. A second, electrically conductive plastic component is incorporated into these cutouts by two-component injection molding. The result is illustrated in FIG. 2. The structures injected using the second plastic component are electrically conductive and have the shape of the electrode structures required for the capacitive switch. These electrode structures 14 have integrally formed contact tags 14a which lead to a contacting block 16a and 16b, respectively, formed integrally on the inside of the housing body. The contacting blocks 16a, 16b have cutouts into which the ends of the contact tags 14a are positioned. The contacting surfaces at the ends of the contact tags 14a are arranged flush in the surface of the contacting blocks 16a, 16b. It can furthermore be seen in FIG. 2 that the electrode structures 14 have recessed windows 18. Cylindrical circuit board supports 20 are furthermore formed integrally on the inside of the housing body 10.

Figure 3:
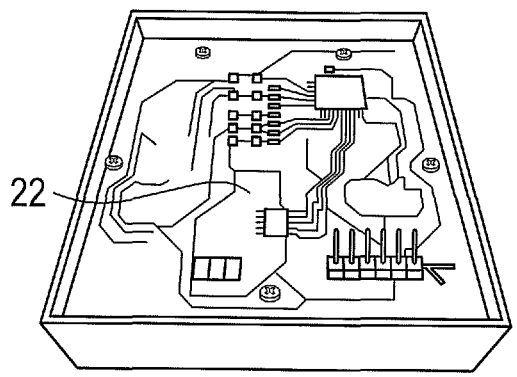
FIG. 3 the switch housing with a circuit board placed thereon.

In the mounted state shown in FIG. 3, a circuit board is placed onto the circuit board supports 20. The tracks of the circuit board 22 comprise contacting regions in a position opposite the contacting blocks 16a, 16b. The connection of the electrode structures 14 with the circuit board is realized by intermediate conductive rubber elements. The circuit board is equipped with the evaluation electronics of the capacitive switch.

Figure 4:
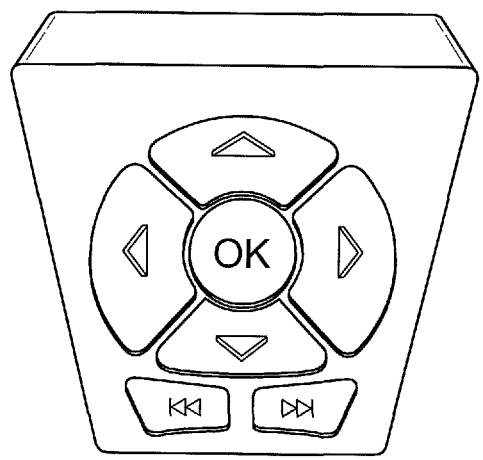
FIG. 4 a perspective view of a capacitive switch produced using the switch housing.

The front side of the completed capacitive switch shown in FIG. 4 is provided with symbols which are associated with the available switching functions. The symbols and letterings are cut out from a coat of paint by a laser beam. Due to the cutouts 12, the material of the switch housing arranged underneath has a reduced wall thickness and is thus well translucent or transparent. Due to the light sources arranged on the circuit board 22, in particular light-emitting diodes, the symbols are illuminated through the windows 18 in the electrode structures 14 from the inside of the switch housing.

A preferred plastic material for the electrically non-conductive first plastic component from which the housing body 10 is injected is polycarbonate. A polycarbonate is also chosen for the second plastic component which has to be electrically conductive, however such a polycarbonate that is electrically conductive by the addition of carbon fibers. Both plastic materials enter into an intimate connection due to the two-component injection molding process. With this method, it is also possible to produce the precise 3-D structures which are required to easily ensure a secure contacting of the electrode structures up to the circuit board in a mass production process. The capacitive switch is well suitable for use in the automotive field due to its robustness, its absence of wear and its corrosion resistance.

The invention claimed is:

1. A switch housing for capacitive switches, having:
   an outer contact surface, and
   flat electrode structures which are arranged on the inside in a position opposite the outer contact surface and which are placed by two-component injection molding in recessed regions of a housing body injected from a first, electrically non-conductive plastic component by a second, electrically conductive plastic component,
   wherein the flat electrode structures have recessed windows and the outer contact surface is translucent opposite the recessed windows,
   wherein the flat electrode structures are configured with integrally formed contact tags which are guided outside the recessed regions of the housing body to a contacting block formed integrally on the inside of the housing body,
   wherein luminous elements illuminate symbols arranged on the outer contact surface of the switch housing through the recessed windows of the electrode structures and through thinned wall regions of the switch housing, the thinned wall regions having a reduced wall thickness,
   wherein the thinned wall regions are free of openings and have a thickness allowing light from the luminous elements to pass therethrough while light is prevented from passing through the remainder of the housing body.

2. The switch housing according to claim 1, wherein both plastic components are a polycarbonate and the second plastic component contains carbon fibers.

3. The switch housing according to claim 1, wherein the contacting block has cutouts into which the ends of the contact tags are positioned and form flush contacting surfaces with the surface of the contacting block.

4. The switch housing according to claim 1, wherein cylindrical track supports are formed integrally with the housing body on the inside.

5. A capacitive switch having a switch housing according to claim 1, wherein a circuit board equipped with an evaluation electronics is arranged at the bottom of the switch housing and is electrically connected to the electrode structures.

6. The switch according to claim 5, wherein the circuit board is additionally equipped with the luminous elements.

7. A switch housing for capacitive switches comprising:
   a housing body injected from a first, electrically non-conductive plastic component, the body including:
   at least one wall having an outer contact surface and defining an inside,
   at least one recessed region formed in one of the walls on the inside opposite the outer contact surface, the at least one recessed region comprising a thinned wall region of the housing body having a reduced wall thickness, and
   at least one contact block formed integrally with the at least one wall on the inside of the body, and
   flat electrode structures injected from a second, electrically conductive plastic component into the at least one recessed region of the housing body, the electrode structures including recessed windows and contact tags formed in contact with the contact blocks, wherein the contact tags are guided outside the recessed regions of the housing body, and
   wherein each thinned wall region is free of openings and has a thickness such that the thinned wall region is transparent to light while the remainder of the housing body is opaque.

8. The switch housing according to claim 7 further comprising symbols provided on the outer contact surface and aligned with the recessed windows and thinned wall regions such that light from luminous elements within the inside of the body passes through the recessed windows and the thinned wall regions to illuminate the symbols.

9. A switch housing for capacitive switches comprising:
   a housing body injected from a first, electrically non-conductive plastic component, the body including:
   at least one peripheral wall defining an inside,
   an end wall closing an end of the inside and including an outer contact surface;
   at least one recessed region formed in the end wall on the inside opposite the outer contact surface, the at least one recessed region being formed from a thinned wall region of the end wall having a wall thickness less than a thickness of the remainder of the end wall, and
   at least one contact block formed integrally with the end wall on the inside of the body, and
   flat electrode structures injected from a second, electrically conductive plastic component into the at least one recessed region of the end wall, the electrode structures including recessed windows extending towards the outer contact surface and contact tags formed in contact with the contact blocks, wherein the contact taps are guided outside the recessed regions of the housing body, and
   wherein each thinned wall region is free of openings and has a thickness such that the thinned wall region is transparent to light while the remainder of the housing body is opaque.

10. The switch housing according to claim 9 further comprising symbols provided on the outer contact surface and aligned with the recessed windows and thinned wall regions such that light from luminous elements on the inside of the body passes through the recessed windows and the thinned wall regions to illuminate the symbols.

11. The switch housing according to claim 1, wherein each flat electrode structure is molded into engagement with one of the thinned wall regions on the inside of the housing body.

12. The switch housing according to claim 1, wherein the contacting block is positioned outside every thinned wall region of the switch housing.

13. The switch housing according to claim 7, wherein each flat electrode structure is molded into engagement with one of the thinned wall regions on the inside of the housing body.

14. The switch housing according to claim 7, wherein the at least one contact block is positioned outside every thinned wall region of the switch housing.

15. The switch housing according to claim 9, wherein each flat electrode structure is molded into engagement with one of the thinned wall regions on the inside of the housing body.

16. The switch housing according to claim 9, wherein the at least one contact block is positioned outside every thinned wall region of the switch housing.

\* \* \* \* \*

UNITED STATES PATENT AND TRADEMARK OFFICE
CERTIFICATE OF CORRECTION

PATENT NO. : 9,722,603 B2
APPLICATION NO. : 13/822302
DATED : August 1, 2017
INVENTOR(S) : Udo Koberstein Page 1 of 1

It is certified that error appears in the above-identified patent and that said Letters Patent is hereby corrected as shown below:

In the Claims

Column 4, Line 58 reads "taps" should read --tags--

Signed and Sealed this
Fifth Day of September, 2017

Joseph Matal
*Performing the Functions and Duties of the*
*Under Secretary of Commerce for Intellectual Property and*
*Director of the United States Patent and Trademark Office*